United States Patent
Witschnig et al.

(10) Patent No.: US 8,749,352 B2
(45) Date of Patent: Jun. 10, 2014

(54) METHOD FOR CODED DATA TRANSMISSION BETWEEN A BASE STATION AND AT LEAST ONE TRANSPONDER WITHIN A WIRELESS DATA TRANSMISSION SYSTEM

(75) Inventors: Harald Witschnig, Gratkorn (AT);
Johannes Bruckbauer, Treubach (AT);
Elisabeth Sonnleitner, Seitenstetten (AT)

(73) Assignee: NXP, B.V., Eindhoven (NL)

( * ) Notice: Subject to any disclaimer, the term of this patent is extended or adjusted under 35 U.S.C. 154(b) by 1467 days.

(21) Appl. No.: 12/439,237

(22) PCT Filed: Aug. 3, 2007

(86) PCT No.: PCT/IB2007/053057
§ 371 (c)(1),
(2), (4) Date: Feb. 27, 2009

(87) PCT Pub. No.: WO2008/026112
PCT Pub. Date: Mar. 6, 2008

(65) Prior Publication Data
US 2009/0322483 A1    Dec. 31, 2009

(30) Foreign Application Priority Data
Aug. 31, 2006 (EP) ..................... 06119879

(51) Int. Cl.
*H04Q 5/22* (2006.01)
(52) U.S. Cl.
USPC .......................... 340/10.1; 375/265
(58) Field of Classification Search
USPC ........... 340/10.1, 5.6–5.65, 7.44, 12.13, 11.1, 340/12.15–12.21, 572.1; 235/494; 341/126, 341/143; 375/265
See application file for complete search history.

(56) References Cited

U.S. PATENT DOCUMENTS

| | | | |
|---|---|---|---|
| 2004/0036626 A1* | 2/2004 | Chan et al. | 340/870.17 |
| 2004/0041695 A1* | 3/2004 | Reining | 340/10.2 |
| 2004/0207391 A1 | 10/2004 | Momose | |
| 2004/0246101 A1* | 12/2004 | Cole | 340/10.1 |
| 2004/0257203 A1 | 12/2004 | Maltsev et al. | |
| 2005/0207391 A1 | 9/2005 | Friedrich | |

FOREIGN PATENT DOCUMENTS

WO    03088499 A1    10/2003

OTHER PUBLICATIONS

Lynch, D.J.,; The Suitability of Various Line Coding Techniques for the Simultaneous Transmission of Data Over Copper Telephone Lines; Thesis Submitted to The College of Graduate Studies and Research in Partial Fullfillment of the Requirements for the Degree of Mater Science in The Department of Electrical Engineering, University of, Dec. 1997.

* cited by examiner

*Primary Examiner* — Brian Zimmerman
*Assistant Examiner* — An T Nguyen

(57) ABSTRACT

A method for coded data transmission between a base station (10) and at least one transponder (20) within a wireless data transmission system (1), the method comprising the steps of: —providing a set of symbols (S1 . . . S2n) for encoding data (DD), wherein the set of symbols (S1 . . . S2n) is divided into at least two sub-sets (SS1, SS2), and wherein each symbol (S1 . . . S2n) of the complete set is assigned to one of said at least two sub-sets (SS1, SS2); —encoding said data (DD) using symbols (S1 . . . S2n) of said at least two sub-sets (SS1, SS2), wherein at least one encoded symbol (S1 . . . S2n) comprises several bits; —transmitting each encoded symbol (S1 . . . S2n) within a symbol duration (SD) of an encoded data signal (DS) between said base station (10) and at least one transponder (20), wherein the sub-set (SS1, SS2) assigned to each encoded symbol (S1 . . . S2n) is indicated by a value of at least one bit (LB) of each encoded symbol (S1 . . . S2n); —identifying the value of said at least one bit (LB) of the transmitted encoded symbols within the encoded data signal (DS); —determining the sub-set (SS1, SS2) assigned to each encoded symbol (S1 . . . S2n) depending on the identified value of said at least one bit (LB); and —decoding each encoded symbol (S1 . . . S2n) according to the determined sub-set (SS1, SS2).

17 Claims, 2 Drawing Sheets

METHOD FOR CODED DATA TRANSMISSION BETWEEN A BASE STATION AND AT LEAST ONE TRANSPONDER WITHIN A WIRELESS DATA TRANSMISSION SYSTEM

FIELD OF THE INVENTION

The invention relates to a method for coded data transmission between a base station and at least one transponder within a wireless data transmission system.

The invention further relates to a transponder and a wireless data transmission system.

BACKGROUND OF THE INVENTION

The importance of radio frequency identification (RFID) systems is still increasing particularly in the service sector, in the field of logistics, in the field of commerce and in the field of industrial production. Thus, contactless identification systems or RFID systems are implemented more and more in these fields and will probably substitute barcode systems in the near future.

In particular, such systems are suitable for wireless data transmission in a fast manner and without cable connections and consist of at least one base station, in particular a reader device and one or more transponders. Different types of transponders are known from the art, in particular depending on their kind of energy supply. Some of said transponders do not have a power supply of their own and are therefore called passive transponders. Passive transponders take the electrical energy required for their own power supply from an electromagnetic field provided by the base station.

For data transmission a transponder can be inductively coupled to said base station and comprises an electronic circuit, usually a microchip, connected to a large area coil that functions as an antenna. If the transponder is moved into an electromagnetic field provided by the base station, a current is induced in the large area coil of the transponder and the electronic circuit of the transponder is powered up.

In general, an inductive coupling is used to transmit data from the transponder to the base station and vice versa using an electromagnetic carrier wave provided by the base station. To this end, an ultra high-frequency (UHF) carrier wave signal or a high-frequency (HF) carrier wave signal is generated by the base station, which is received by the antenna of the transponder. Said electromagnetic carrier wave signal may have a frequency of for instance approximately 13 MHz (HF) or approximately 800 to 900 MHz (UHF).

For Near Field Communication (NFC) reflection characteristics of the antenna can be influenced by altering a load connected to the antenna of the transponder. In order to transmit data from the transponder to the base station, for example a load resistor, being connected in parallel with the coil is switched on and off in time with a data stream to be transmitted via an air interface. An amplitude of a reflected portion of electromagnetic carrier wave can thus be modulated (so called load-modulation).

Contrary to that, far field communication systems are based on a radar principle. A portion of the incoming power of said electromagnetic carrier wave signal produced by the base station is reflected by the antenna of the transponder and returned to the base station. This is also referred to as "backscatter" principle.

Additionally, subcarrier modulation techniques can be applied in combination with said load modulation. In said techniques, a data signal is modulated on a subcarrier signal and in accordance with that, the load of the transponder is switched on and off. The subcarrier signal may have a frequency of 848 kHz, for instance. In the base station the backscattered signal is received by an antenna and the transmitted data signal is then restored based on an evaluation of the backscattered signal.

A data signal to be transmitted consists of a sequence of symbols, each of which being coded according to a coding scheme and transmitted by the transponder within a predefined time interval or a what is called symbol duration. Possible coding schemes for such RFID systems are for instance Manchester, modified Miller, Non Return to Zero, Pulse Interval Encoding, etc. Other, higher order modulation and/or coding schemes can be used as well.

Using load modulation based on a coded subcarrier signal, an enhancement of a transmission rate is limited by the frequency of the subcarrier signal. Based on the subcarrier frequency used, a symbol duration is given to which a specific coding is applied. In conventional RFID systems, numerous higher order coding methods are applied. One of these methods is characterized by the fact, that within a predefined length of a symbol duration of an encoded symbol, a position of a transition from a High levelHigh level to a Low level of an encoded signal within the symbol duration defines one symbol of a coded character set. To form different symbols, the transition from the High level to a Low levelLow level of the encoded signal is shifted from sample to sample, each sample characterizing a unique symbol of the encoded character set. For a detection of the transition from the High- to the Low level at the base station an integrator may be used. Nevertheless it is to be mentioned that the number of symbols within a symbol duration is limited—without enhancing the complexity tremendously, resulting in still very low data rates.

From WO-03088499 A1 is known a method of coding data communication between a base station and an RFID transponder, wherein the data are encoded by an active time period of sub-carrier modulation and an inactive time period of no modulation. The modulation characteristics of the modulation such as phase and/or frequency are varied during the active time period in order to increase the data rate to be transmitted from the transponder to the base station.

US 2004/0257203 A1 describes a data encoding and decoding method within an RFID system having an improved error detection as well as error correction.

US 2005/0207391 A1 discloses a method for wireless data transmission between a base station and at least one transponder, in which an electromagnetic carrier wave is emitted by the base station and symbols are transmitted from a given transponder to the base station by modulating and backscattering the electromagnetic carrier waves. The transmission rate can be enhanced by changing the modulation state synchronously to a synchronization marker transmitted by the base station.

Significantly higher data rates will be needed for future applications. Therefore, new coding strategies and concepts of data transmission are needed in the technical field of RFID. The conventional technologies will not be able to fulfill these needs, except at the price of extremely difficult signal processing.

OBJECT AND SUMMARY OF THE INVENTION

It is an object of the invention to provide a method for coded data transmission between a base station and at least one transponder within a wireless data transmission system, respectively an RFID system, overcoming the technical drawbacks mentioned above.

In order to achieve the object defined above, a method according to the invention can be characterized in the way defined below:

A method for coded data transmission between a base station and at least one transponder within a wireless data transmission system, the method comprising the steps of:

providing a set of symbols for encoding data, wherein the set of symbols is divided into at least two sub-sets and each symbol of the set is assigned to one of said at least two sub-sets;

encoding said data using symbols of said at least two sub-sets, wherein at least one encoded symbol comprises several bits;

transmitting each encoded symbol within a symbol duration of an encoded data signal between said base station and at least one transponder, wherein the sub-set assigned to each encoded symbol is indicated by the value of at least one bit of each encoded symbol;

identifying a value of said at least one bit of the transmitted encoded symbols within the encoded data signal;

determining the sub-set being assigned to each encoded symbol depending on the identified value of said at least one bit; and decoding each encoded symbol according to the determined sub-set.

The proposed coding concept introduces a what is called "leading bit" within an encoded symbol with a higher priority than all remaining bits of the encoded symbol. Said "leading bit" is arranged at a predefined position within a given symbol-duration of the encoded symbol. The value of the leading bit identifies at least one half of a complete set of code symbols. Depending on the value of the leading bit (e.g. "High" Level or "Low" Level), the encoded symbol is allocated to a specific half of the complete set of encoded symbols. As a result, advantageously, the data transfer rate can be increased significantly. Also, a processing complexity can be reduced by increasing the bit duration within the symbol duration.

Advantageously, said at least one bit indicating the sub-set of each encoded symbol can be arranged at a predefined position within said symbol duration of the encoded data signal.

According to an embodiment, a higher priority is assigned to said at least one bit compared to the remaining bits of each encoded symbol, enabling an evaluation of an encoded symbol.

Further advantageously, said step of transmitting each encoded symbol within a given symbol duration comprises a load-modulation of an electromagnetic carrier signal according to said encoded data signal, whereas the load of said transponder is altered according to the encoded symbols of said encoded data signal.

According to a further embodiment, one half of said complete set of symbols is assigned to a first sub-set and the other half of said complete set of symbols is assigned to a second sub-set.

In a further preferred embodiment of the method according to the invention, one half of said set of symbols is assigned to a first sub-set and the other half of said set of symbols is assigned to a second sub-set. Each encoded symbol assigned to said first sub-set is realized via a falling edge within said given symbol duration of said encoded data signal or by a permanent first level of said encoded data signal. Each encoded symbol being assigned to said second sub-set is realized via a rising edge within said given symbol duration of said encoded data signal or by a permanent second level of said encoded data signal.

The object of the invention is furthermore achieved by a transponder comprising an antenna connected to an electronic circuit, the transponder comprising:

a memory unit for storing data, a control module attached to said memory unit for encoding said data according to a set of symbols to generate an encoded data signal, whereas said set of symbols is divided into at least two sub-sets, each symbol of said set being assigned to one of said at least two sub-sets and at least one encoded symbol comprising several bits; and wherein the sub-set assigned to each encoded symbol is indicated by the value of at least one bit of each encoded symbol; wherein said control module is attached to a radio frequency communication module for receiving an electromagnetic carrier signal and for transmitting said encoded data signal via load-modulation of said electromagnetic carrier signal.

These and other aspects of the invention are apparent from and will be elucidated with reference to the embodiments described hereinafter.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
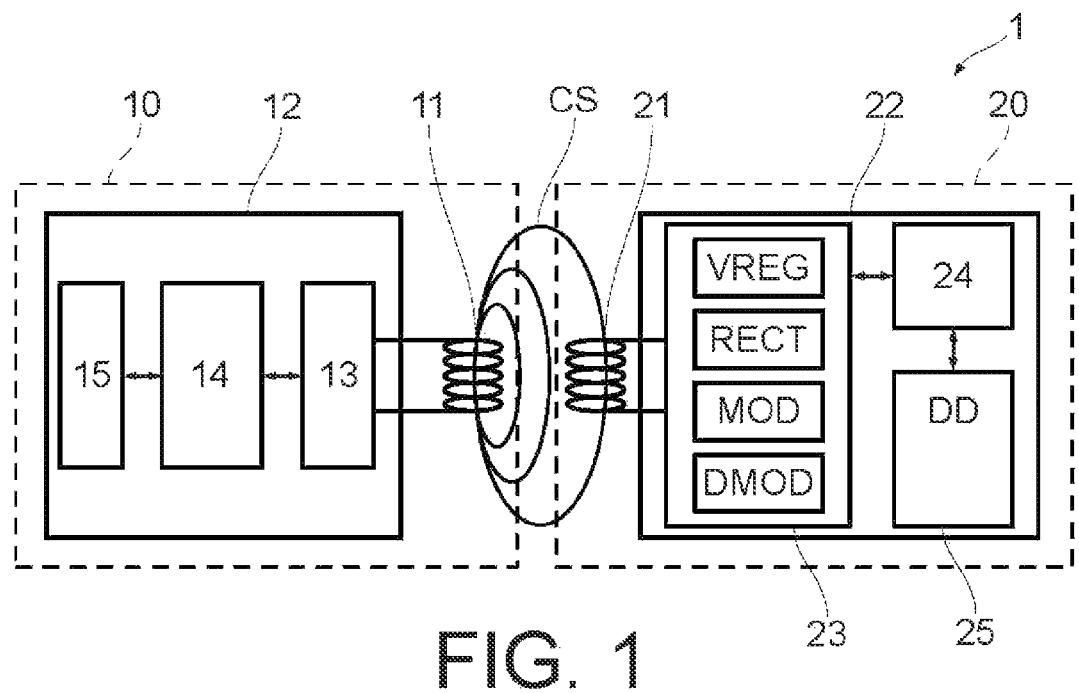
FIG. 1 shows a block diagram of a conventional wireless data transmission system.

FIG. 1 shows by way of example a block diagram of a wireless data transmission system 1, in particular a radio frequency identification (RFID) system comprising a base station 10 and a transponder 20. The base station 10 is either capable of receiving data from said transponder 20 as well as transmitting data to said transponder 20 and may be realized as an RFID reader device.

The base station 10 further comprises an antenna 11 and an electronic circuit 12 connected to said antenna 11. The electronic circuit 12 comprises a radio frequency communication module 13 and a control module 14, whereas the radio frequency communication module 13 is attached to the control module 14. Said radio frequency communication module 13 is further connected to the antenna 11 and is therefore capable of transmitting and receiving an electromagnetic carrier signal CS.

The electromagnetic carrier signal CS is used both for wireless data communication between the base station 10 and the transponder 20 and for energizing the transponder 20 in a case where the transponder 20 is configured as a passive transponder. In a case where the transponder 20 is designed as an active transponder, the active transponder has a power source of its own, e.g. a battery. In addition to this, a memory unit 15 is attached to said control module 14, which may be configured as a non-volatile memory, like a PROM, EEPROM or the like. The control module 14 is designed to communicate with the memory unit 15 and the radio frequency communication module 13 and is further capable to process a control routine or an application program, respectively.

The transponder 20 comprises an antenna 21 and an electronic transponder circuit 22. The transponder 20 is preferably configured as a passive transponder 20 and is powered by the electromagnetic carrier signal CS provided by the base station 10. The electronic transponder circuit 22 comprises an analogue radio frequency interface 23 connected to the antenna 21, a digital control unit 24 connected to the analogue radio frequency interface 23 and to a memory unit 25. The memory unit 25 may be configured as a non-volatile memory, like an EEPROM, so that data DD stored in said memory unit 25 still remain stored even if the transponder 20 is switched off. The memory unit 25 may also contain a program code for operating the digital control unit 24 and data, for example a unique identification number. The digital control unit 24 communicates with the memory unit 25 and the analog radio frequency interface 23 and is capable of processing a control routine or an application program.

A data exchange between the base station 10 and the transponder 20 may be accomplished according to at least one data transmission protocol using a modulation or a subcarrier modulation technique. For instance, an encoded data signal DS provided by the digital control unit 24 of the transponder 20 is load modulated on the electromagnetic carrier signal CS or subcarrier signal contained in the electromagnetic carrier signal CS. Said electromagnetic carrier signal CS or subcarrier signal contained in the electromagnetic carrier signal CS is modulated by switching a load impedance is connected to the antenna 21 of the transponder 20, so that a varying energy is drawn from the electromagnetic carrier signal CS or subcarrier signal. Switching the load impedances at the transponder 20 causes a change of the impedance of the antenna 21 of the transponder 20 and hence a varying amplitude of a voltage at the antenna 21 of the transponder 20, which varying voltage amplitude represents an input signal to the radio frequency communication module 13 at the base station 10. For a recovery of data contained in said input signal the input signal is rectified or demodulated by said radio frequency communication module 13, yielding to a restored encoded data signal DS* (not shown). The control module 14 extracts the data encoded in the restored encoded data signal DS*, e.g. by comparing it with a set of code symbols.

In the transponder 20 the antenna 21 is designed to receive the electromagnetic carrier signal CS from the base station 10 and to pass the electromagnetic carrier signal CS to the analog radio frequency interface 23. In principle, the analog radio frequency interface 23 comprises a rectifier RECT and a voltage regulator VREG with an integrated energy storage element, such as a capacitor, to derive from the received electromagnetic carrier signals CS the necessary operating voltage for the digital control unit 24. Furthermore, the analog radio frequency interface 23 comprises a demodulator DMOD to extract a data signal from the electromagnetic carrier signal CS and to pass the data signal to the digital control unit 24. The digital control unit 24 processes the received data signal, in particular decodes the received data signal.

Additionally, the digital control unit 24 creates at least one encoded data signal DS and passes the encoded data signal DS to the analog radio frequency interface 23. The analog radio frequency interface 23 further comprises a modulator MOD which modulates the encoded data signal DS on said electromagnetic carrier signal CS or a subcarrier signal contained in electromagnetic carrier signal CS and transmits the modulated transmission signal to the base station 10.

It should be noted at this point that not all elements, which are usually part of a transponder are shown, but only those elements that are necessary to explain the invention.

The transponder 20 is designed to transmit said encoded data signal DS to the base station 10. In the present example, which refers to an inductively coupled wireless data transmission system 1, this is done by a load modulation of the electromagnetic field provided by the base station 10 via the electromagnetic carrier signal CS. But it has to be noted, that the invention is applicable in an equivalent way to other wireless data transmission systems 1, in particular to backscatter coupled systems, close coupled systems, and so on.

For the coding of the preferably digital data DD stored in the memory unit 25 of the transponder 20 a new coding/modulation scheme according to the invention is provided. Therefore, the data DD stored in the memory unit 25, which has to be transmitted via the air interface to the base station 10 has to be encoded by the digital control unit 24. The coding realized by the digital control unit 24 is aligned with a higher order coding scheme consisting of a complete set of encoded symbols S1 ... S2$n$, wherein at least one encoded symbol S1 ... S2$n$ represents several bits of said data DD. According to the proposed coding scheme, a number of 2n possible symbols S1 ... S2$n$ are available for the representation of the preferably digital data DD to be transmitted within a given symbol duration SD, whereas according to the bandwidth of the transmission channel or the symbol duration SD, n different encoded symbols S1 ... Sn, Sn+1 ... S2$n$ can be transmitted. A length of the symbol duration SD is defined by the carrier/subcarrier frequency used, whereas one encoded symbol S1 ... S2$n$ is transmitted during the symbol duration SD.

According to the invention, the complete set of symbols S1 ... S2$n$ available for encoding said data DD is divided into at least two sub-sets SS1, SS2, each symbol S1 ... S2$n$ being assigned to one of said at least two sub-sets SS1, SS2. In a preferred embodiment, said complete set of symbols S1 ... S2$n$ is divided into a first sub-set SS1 consisting of the first half of the symbols S1 ... Sn and a second sub-set SS2 comprising the second half of the symbols Sn+1 ... S2$n$.

As the data transmission rate is limited by the bandwidth of the transmission channel (the length of the symbol duration SD, respectively), the invention advantageously offers the possibility of almost doubling said data rate by assigning to each sub-set SS1, SS2 a defined bundle of symbols S1 ... Sn, Sn+1 ... S2$n$ and by indicating the sub-sets SS1, SS2 by means of the value of at least one specific bit ("leading bit" LB of each encoded symbol S1 ... S2$n$).

Said leading bit LB can preferably be arranged at a predefined position within said symbol duration SD, for example at the first or last bit position of an encoded symbol S1 ... S2$n$. Needless to say, that any bit position within an encoded symbol S1 ... S2$n$ can be chosen as predefined position as well. Once defined, the position of the leading bit LB stays fixed during data transmission.

Furthermore, a higher priority is assigned to said leading bit LB compared to priorities of the remaining bits of each encoded symbol S1 ... S2$n$, resulting in a preferred evaluation of said leading bit LB compared to the remaining bits of the encoded symbol S1 ... S2$n$. In particular, the bits of an encoded symbol S1 ... S2$n$ having a higher priority assigned are evaluated prior to the remaining bits of said encoded symbol S1 ... S2$n$.

To encode the data DD in the transponder 20, the digital control unit 24 uses encoded symbols S1 ... S2$n$ from the first and second sub-sets SS1, SS2, whereas each encoded symbol S1 ... Sn being assigned to said first sub-set SS1 is realized by setting the "leading bit" LB to a first level, preferably a High level, and by arranging a falling edge FE within said given symbol duration SD. Also, a permanent High level within said given symbol duration DS could be set to said encoded data signal DS (shown in the upper part of FIG. 2 and in the left hand side of FIG. 3). For encoding a symbol Sn+1 . . . S2n assigned to said second sub-set SS2, the value of the "leading bit" LB is set to a second level, preferably a Low level and a rising edge RE or a permanent second level (in particular a Low level) of said encoded data signal DS is positioned within the symbol duration DS (see lower part of FIG. 2 and right hand side of FIG. 3).

Thus, the sub-sets SS1, SS2 assigned to the encoded symbol S1 . . . S2n can be determined from the encoded data signal DS by evaluating the value of the "leading bit" LB of each encoded symbol S1 . . . S2n. A single symbol of the first or second sub-set SS1, SS2 is determined by an evaluation of the amplitude of the encoded data signal DS, in particular an evaluation of the value or the variation of the value of the signal amplitude of the encoded data signal DS within the given symbol duration SD.

Figure 2:
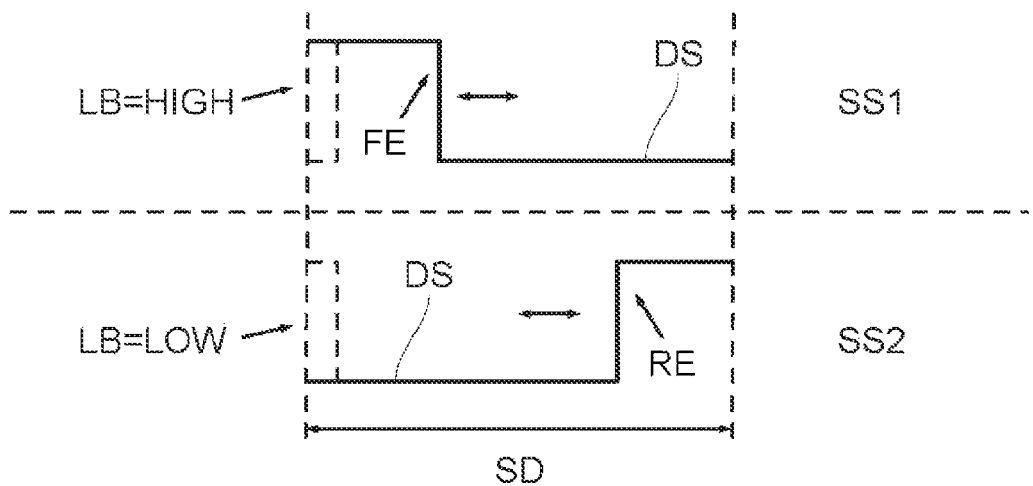
FIG. 2 shows in principle an encoded symbol of a first and a second sub-set according to the invention.

In the diagram of FIG. 2 a first encoded symbol S1 . . . Sn of the first sub-set SS1 and a second encoded symbol Sn+1 . . . S2n of the second sub-set SS2 are shown by way of example. The diagram has to be interpreted as follows: in principle a load modulation based on said carrier or subcarrier frequency is carried out. Based on the defined carrier or subcarrier frequency, the symbol duration DS shown is given. To indicate that an encoded symbol is assigned to the first sub-set SS1, the value of the "leading bit" LB of said encoded symbol is set to a logical High level. To indicate that an encoded symbol is assigned to the second sub-set SS2, the value of the "leading bit" LB of said encoded symbol is set to a logical Low level.

In addition, the encoded symbol of the encoded data signal DS assigned to the first sub-set SS1 further consists of a falling edge FE and the encoded symbol of the encoded data signal DS assigned to the second sub-set SS2 further consists of a rising edge RE. Thus, the proposed coding scheme is characterized by the features that within a predefined length of a symbol duration SD of an encoded symbol, the position of a transition from a High level to a Low level (from a Low level to a High level, respectively) of said encoded data signal DS, defines, together with the value of the "leading bit" LB exactly one unique symbol S1 . . . S2n out of a complete set of symbols S1 . . . S2n.

Figure 3:
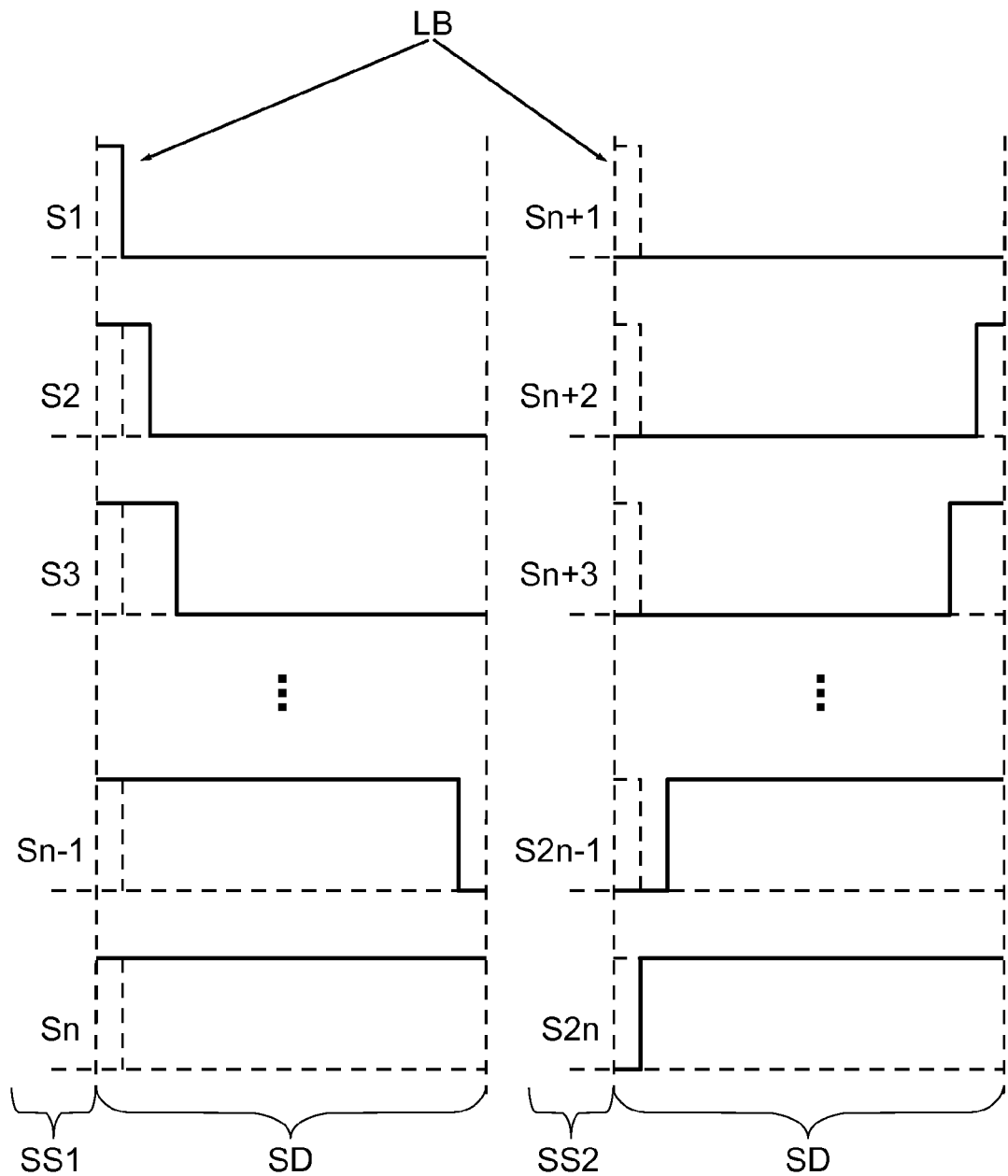
FIG. 3 shows in principle a set of symbols divided into a first and a second sub-set.

To form different symbols S1 . . . Sn, Sn+1 . . . S2n within the sub-sets SS1, SS2, the transition from the High level to the Low level ("falling edge FE"), or the transition from the Low level to the High level ("rising edge RE"), respectively, of the encoded data signal DS is "shifted" as shown in FIG. 3. According to FIG. 3, the falling edge FE of the encoded data signal DS to form the symbols S1 . . . Sn of the first sub-set SS1 is shifted from a left border of the symbol duration SD to a right border of the symbol duration SD, whereas the "leading bit" LB is the first bit position on the left hand side of the symbol duration SD. Symmetrical thereto, in order to form the symbols Sn+1 . . . S2n of the second sub-set SS2, the rising edge RE of the encoded data signal DS is shifted from the right border to the left border of the symbol duration SD.

Via the encoding of the data DD by the digital control unit 24 using the first and second sub-sets SS1, SS2 of symbols S1 . . . Sn, Sn+1 . . . S2n, said encoded data signal DS is generated by the transponder 20. The encoded data signal DS is then modulated by the modulator MOD of the analog radio frequency interface 23, e.g. on a subcarrier frequency. As a result of the modulation, said subcarrier frequency is included in the electromagnetic carrier signal CS. Resulting from the inductive coupling between the transponder 20 and the base station 10, the load-modulated electromagnetic carrier signal CS causes a change of the impedance of the antenna 11 of the base station 10. Hence, a varying amplitude of a voltage at the antenna 11 is generated.

The voltage variation represents an input signal to the radio frequency communication module 13. For a recovery of the information contained in the received input signal, the input signal is rectified and/or demodulated by said radio frequency communication module 13, yielding a restored encoded data signal DS*. The control module 14 extracts the data DD encoded in the restored encoded data signal DS*, e.g. by comparing it with a set of encoded symbols S1 . . . S2n.

To this end, the value of the "leading bit" LB of each encoded symbol S1 . . . S2n of the restored encoded data signal DS* is identified. Depending on the identified value of the "leading bit" LB, the sub-set SS1, SS2 being assigned to said encoded symbol S1 . . . S2n is determined. After that, the determined sub-set SS1, SS2 is used for a decoding process of the encoded symbol S1 . . . S2n. In particular, the encoded symbols S1 . . . Sn, Sn+1 . . . S2n being assigned to the determined sub-set SS1, SS2 are compared with each encoded symbol S1 . . . S2n of the restored encoded data signal DS*, resulting in the data DD having been transmitted. An integrator means is preferably used for a detection of a falling edge FE or a rising edge RE within the symbol duration SD of the restored encoded data signal DS*.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method for coded data transmission between a base station and at least one transponder within a wireless data transmission system, the method comprising the steps of:
   providing a set of symbols for encoding data, wherein the set of symbols is divided into at least two sub-sets, each symbol of the set being assigned to one of said at least two sub-sets;
   encoding said data using symbols of said at least two sub-sets, wherein at least one encoded symbol comprises several bits;
   transmitting each encoded symbol within a symbol duration of an encoded data signal between said base station and said transponder, wherein the sub-set assigned to each encoded symbol is indicated by the value of at least one bit of each encoded symbol and wherein said at least one bit is arranged at the same predefined position within said symbol duration of each encoded symbol of the encoded data signal, said at least one bit indicating the sub-set of each encoded symbol;
   identifying a value of said at least one bit of the transmitted encoded symbols within the encoded data signal;
   determining the sub-set being assigned to each encoded symbol depending on the identified value of said at least one bit; and decoding each encoded symbol according to the determined sub-set.

2. The method according to claim 1, further comprising the step of:
assigning a higher priority to said at least one bit indicating the sub-set of each encoded symbol compared to the remaining bits of each encoded symbol and evaluating the bits of each encoded symbol.

3. The method according to claim 1, wherein the step of transmitting each encoded symbol within the given symbol duration comprises:
load-modulating an electromagnetic carrier signal in accordance with said encoded data signal.

4. The method according to claim 3, wherein the load of said at least one transponder is altered according to the encoded symbols of said encoded data signal.

5. The method according to claim 3, wherein a subcarrier modulation technique is applied.

6. The method according to claim 1, wherein one half of said set of symbols is assigned to a first sub-set, and another half of said set of symbols is assigned to a second sub-set of the encoded symbols.

7. The method according to claim 6, wherein each encoded symbol which is assigned to said first sub-set is realized via a falling edge within said given symbol duration of said encoded data signal, or by a permanent first level of said encoded data signal.

8. The method according to claim 6, wherein each encoded symbol which is assigned to said second sub-set is realized via a rising edge within said given symbol duration of said encoded data signal, or by a permanent second level of said encoded data signal.

9. A transponder comprising an antenna connected to an electronic circuit, the transponder comprising:
a memory unit for storing data;
a control module being attached to said memory unit for encoding said data according to a set of symbols to generate an encoded data signal, whereas said set of symbols is divided into at least two sub-sets, each symbol of said set of symbols being assigned to one of said at least two sub-sets, wherein at least one encoded symbol comprises several bits; and wherein the sub-set which is assigned to each encoded symbol is indicated by the value of at least one bit of each encoded symbol and wherein said control module is configured to arrange said at least one bit indicating the sub-set of each encoded symbol at the same predefined position within said symbol duration of each encoded symbol of the encoded data signal; and
wherein said control module is attached to a radio frequency communication module for receiving an electromagnetic carrier signal and for transmitting said encoded data signal via load-modulation of said electromagnetic carrier signal.

10. The transponder according to claim 9, wherein said control module is designed to assign a higher priority to said at least one bit indicating the sub-set of each encoded symbol compared to remaining bits of each encoded symbol.

11. The transponder according to claim 9, wherein the transponder is designed to perform said load-modulation according to the encoded symbols of said encoded data signal.

12. A wireless data transmission system comprising a base station inductively coupled to at least one transponder, wherein said base station and said at least one transponder are designed to carry out the steps of the method according to claim 1.

13. The method according to claim 1, wherein the value of the leading bit in an encoded symbol indicates the sub-set of the symbol and wherein the position of a transition of the leading bit within the encoded symbol combined with the value of the leading bit together define exactly one unique symbol out of the set of symbols.

14. The method according to claim 13, wherein the transition of the leading bit within the encoded signal is either from a high level to a low level or from a low level to a high level.

15. The transponder according to claim 9, wherein the value of the leading bit in an encoded symbol indicates the sub-set of the symbol and wherein the position of a transition of the leading bit within the encoded symbol combined with the value of the leading bit together define exactly one unique symbol out of the set of symbols.

16. The transponder according to claim 15, wherein the transition of the leading bit within the encoded signal is either from a high level to a low level or from a low level to a high level.

17. A method for coded data transmission between a base station and at least one transponder within a wireless data transmission system, the method comprising the steps of:
providing a set of symbols for encoding data, wherein the set of symbols is divided into at least two sub-sets, each symbol of the set being assigned to one of said at least two sub-sets;
receiving data that is encoded using symbols of said at least two sub-sets, wherein at least one encoded symbol comprises several bits, wherein the sub-set assigned to each encoded symbol is indicated by the value of at least one bit of each encoded symbol and wherein said at least one bit is arranged at the same predefined position within said symbol duration of each encoded symbol of the encoded data signal, said at least one bit indicating the sub-set of each encoded symbol;
identifying a value of said at least one bit of the transmitted encoded symbols within the encoded data signal;
determining the sub-set being assigned to each encoded symbol depending on the identified value of said at least one bit; and
decoding each encoded symbol according to the determined sub-set.

* * * * *